United States Patent [19]

Veligdan

[11] Patent Number: 5,491,470
[45] Date of Patent: Feb. 13, 1996

[54] VEHICLE SECURITY APPARATUS AND METHOD

[75] Inventor: James T. Veligdan, Manorville, N.Y.

[73] Assignee: Associated Universities, Inc., Washington, D.C.

[21] Appl. No.: 228,715

[22] Filed: Apr. 18, 1994

[51] Int. Cl.[6] .......................... G06F 7/04; B60R 25/04; H03K 17/94
[52] U.S. Cl. .................. 340/825.310; 307/10.300; 307/10.500; 341/35; 180/287
[58] Field of Search ................. 340/825.31, 825.57, 340/539, 426, 429, 430; 341/35; 180/287, 288, 289, 107; 307/10.1, 10.2, 10.3, 10.4, 10.5; 70/277, 278, DIG. 51

[56] References Cited

U.S. PATENT DOCUMENTS

| | | | |
|---|---|---|---|
| 4,236,594 | 12/1980 | Ramsperger | 180/167 |
| 4,250,533 | 2/1981 | Nelson | 340/825.31 |
| 4,258,352 | 3/1981 | Lipshutz | 340/825.31 |
| 4,291,296 | 9/1981 | Seifers | 180/287 |
| 4,310,754 | 1/1982 | Check, Jr. | 340/825.57 |
| 4,727,368 | 2/1988 | Larson et al. | 340/825.31 |
| 4,742,327 | 5/1988 | Burgess | 340/426 |
| 4,762,199 | 8/1988 | Holmes | 182/2 |
| 4,766,433 | 8/1988 | Herman et al. | 340/825.31 |
| 4,835,407 | 5/1989 | Kataoka et al. | 340/825.31 |
| 5,049,729 | 9/1991 | Dease | 340/825.31 |
| 5,079,435 | 1/1992 | Tanaka | 340/825.31 |
| 5,119,065 | 6/1992 | Wiehagen | 340/825.31 |
| 5,132,661 | 7/1992 | Pinnow | 340/825.31 |
| 5,159,334 | 10/1992 | Baument et al. | 340/825.31 |
| 5,254,996 | 10/1993 | Claar et al. | 342/426 |
| 5,274,354 | 12/1993 | Sato | 340/539 |
| 5,401,924 | 3/1995 | Armanno, Sr. | 307/10.2 |

*Primary Examiner*—Alyssa H. Bowler
*Assistant Examiner*—Mark H. Rinehart
*Attorney, Agent, or Firm*—Margaret C. Bogosian

[57] ABSTRACT

A vehicle security apparatus for use in a motor vehicle, the apparatus comprising an optical key, a receptacle, a receiver and at least one optical fiber. The optical key has a transmitter having at least one first preprogrammed coded signal stored in a first electric circuit. The receptacle receives the optical key and at least one transmittable coded optical signal from the transmitter corresponding to the at least one preprogrammed coded signal stored in the first electric circuit. The receiver compares the at least one transmittable coded optical signal to at least one second preprogrammed coded signal stored in a second electric circuit and the receiver is adapted to trigger switching effects for at least one of enabling starting the motor vehicle and starting the motor vehicle upon determination that the at least one transmittable coded optical signal corresponds to the at least one second preprogrammed signal in the second electric circuit. The at least one optical fiber is operatively connected between the receptacle and the receiver for carrying the optical signal from the receptacle to the receiver. Also disclosed is a method for permitting only authorized use of a motor vehicle.

2 Claims, 3 Drawing Sheets

VEHICLE SECURITY APPARATUS AND METHOD

This invention was made with Government support under contract number DE-AC02-76CH00016, between the U.S. Department of Energy and Associated Universities, Inc. The Government has certain rights in the invention.

BACKGROUND OF THE INVENTION

The present invention relates generally to security systems. More particularly, this invention relates to a vehicle security apparatus and method for enabling a motor vehicle to be started or for starting a motor vehicle, both of which prevent unauthorized use and theft of an automobile or motor vehicle.

On an economical level, vehicle theft causes the yearly loss of millions of dollars in the United States. The severity of economic loss from vehicle theft continues to increase, particularly in the case where the value of a vehicle is worth more as individual parts than as a complete operating vehicle. On an emotional level, vehicle theft causes anguish and suffering to a vehicle owner upon discovery that his or her parked vehicle along with other important and valuable items contained inside have been stolen.

Vehicle manufacturers generally install conventional tumbler locks operable by keys for use on doors, trunks, and ignition switches for preventing unauthorized use and combating vehicle theft. Similar tumbler locks are typically used to protect access to the ignition system of such vehicles. A problem particularly associated with a conventional ignition switch used to start the motor vehicle is that the ignition switch is electrically connected in series between two separate electrical circuits required for starting the vehicle's motor. Specifically, in such an arrangement a first electrical circuit connects the ignition switch electrically in series between the vehicle's 12 volt battery and the vehicle's coil. A second electrical circuit connects the ignition switch electrically in series between the vehicle's battery and the vehicle's starter solenoid. In operation, when the ignition switch is in the "OFF" position both electrical circuits are open and the motor is not operable. By rotating a key in the ignition switch to the "ON" position, the first electrical circuit is closed and current flows from the battery to the coil for supply of electrical power to the vehicle's distributor and spark plugs. By momentarily further rotating the key in the ignition switch to the "START" position the second electrical circuit is momentarily closed and current flows from the battery to the starter solenoid to activate the vehicle's starter motor and start the motor. Use of such a conventional series-connected ignition switch permits even an inept thief to easily and quickly start the motor vehicle without a key by circumventing the ignition switch to connect the electrical circuits. In other words, a thief can easily, "hot-wire" a vehicle to by-pass such a conventional ignition switch to start the motor vehicle.

Some anti-theft systems for vehicles modify a conventional ignition switch of tumbler locks operable by keys to prevent unauthorized use of a motor vehicle and to combat vehicle theft by a thief "hot wiring" the electrical circuits to start the motor vehicle. For example, one vehicle manufacturer installs in its upper end model lines a Vehicle Anti-Theft (VAT) System that includes an ignition pass key, a modified conventional ignition switch, a decoder module and a starter enable relay electrically connected in series between the ignition switch and the vehicle's starter solenoid. Specifically, the VAT system modified ignition switch has contacts for engaging a single electrical resistor pellet embedded in the upper shaft of the key. The single resistance value of the pellet is compared against a resistance value stored in the decoder module that is remotely located from the ignition switch. If the resistance value of the pellet is correct, the decoder module grounds the starter enable relay that enables current to flow to the starter solenoid when the key in the ignition switch is momentarily rotated to the "START" position.

Another example of a modified conventional ignition switch is described in U.S. Pat. No. 5,132,661 granted to Pinnow, which discloses a security system that includes a modified conventional ignition switch having an optical key shape reader to photo-electrically derive a single electric signal from shape characteristics of a key widen the key is inserted in the ignition switch. The shape characteristics of the key consist of the standard contoured shape of a key, or a pattern of slots or holes which are introduced into the upper or lower shaft of the key. The signal is transmitted through wires to a decoder at a remote location where the signal is processed to determine whether it corresponds to a valid key shape. If the signal corresponds to a valid key shape, the decoder issues an enable signal to a relay to enable an appropriate function, thereby, enabling the vehicle's starter or its fuel injector.

A problem with the above systems is the limitation to only a single signal out of a few possibilities. In one embodiment of the VAT system the value of resistance is limited to one of 15 different resistance values ranging from 380 ohms to 12,300 ohms. In Pinnow, the system is limited to shape characteristics which produce a discernible signal, such as well-defined key cuts, or 3 to 4 slots or holes introduced in the upper or lower shaft portion of the key.

Another problem associated with the VAT system is that the resister pellet is likely to fall out, become dirty, or receive improper electrical contact, all of which will lead to improper identification. Another problem associated with the system disclosed by Pinnow, is that the signal is not constant but varies each time the vehicle owner inserts the key into the ignition switch to generate a signal. Specifically, insertion of the key activates a light emitting diode and decoder for processing the shape characteristics of the key in which the generated signal is dependent on the speed with which the vehicle owner inserts the key. The varying signal thus generated lead to an increased likelihood that use of an authorized key will produce a signal that is misinterpreted by the decoder as an unauthorized use. Misinterpretation by the decoder is particularly troublesome since both systems incorporate delay modes which require a vehicle owner to wait several minutes before retrying to start the motor vehicle.

Other anti-theft systems work in combination with conventional mechanisms of tumbler locks operable by keys to prevent or deter a thief by increasing the difficulty and time associated in stealing a vehicle. For example, U.S. Pat. No. 5,119,065, granted to Wiehagen, discloses a lock body having two discrete electromagnetic radiation emitters connected by optical fibers to the side of the lock body so that electromagnetic radiation traverses a key receiving slot. Insertion of a key into the slot containing the proper predetermined corresponding areas, one for reflection of the radiation and an other for absorption of the radiation, activates a desired operation in the motor vehicle. The optical fibers are used solely for transmission or retransmission of the same radiation from the emitters.

Still other anti-theft systems replace the conventional mechanisms of tumbler locks operable by keys. For example, U.S. Pat. No. 4,742,327 granted to Burgess et al., discloses a device to prevent access to the interior of a vehicle by use of a keyless access and security system that includes a piezoelectric permutation touch pad unit. A person seeking access must enter the correct access code combination on the touch pad to open the door or trunk. Upon entering an improper access code an alarm system is activated. A drawback of this system is the time-consuming effort required by the vehicle owner to properly enter the correct sequence of various numbers each time upon entering a locked motor vehicle.

For completeness, U.S. Pat. No. 5,159,334 granted to Baumert et al., discloses a remote-control system for locks. The disclosed system includes an infrared hand-held transmitter that is used for remote control of the central locking system of a motor vehicle. In addition, the transmitter can be received in a receptacle from which the transmitter can transmit a signal through a optical fiber to a plurality of exit holes on the vehicle body outer skin for transmission of the signal to an external garage door driver. Baumert et al. neither teaches the use of a transmitter as a vehicle security apparatus for enabling the motor vehicle to be started nor as a vehicle security apparatus for starting the motor vehicle, and instead teaches away from the invention herein described by directing a signal initially within the vehicle out and away from the vehicle.

SUMMARY OF THE INVENTION

Accordingly, it is an object of the present invention to provide an improved vehicle security apparatus utilizing an optical key for storing and generating an electronically coded signal to permit reliable and consistent authorized use of a motor vehicle, while effectively barring unauthorized use.

It is also an object of the present invention to provide a vehicle security apparatus having an optical key that is readily programmable so that every motor vehicle employing such a vehicle security apparatus can be independently programmed with a uniquely coded signal or signals.

It is another object of the present invention to provide a vehicle security apparatus having an optical key for transmitting a coded signal in optical form to permit only authorized use of a motor vehicle.

It is a further object of the present invention to provide a vehicle security apparatus that enables starting the motor vehicle via electronically generated coded optical signals.

Another object of the present invention is to provide a preferred alternative vehicle security apparatus that eliminates the need for a conventional ignition switch attached to the vehicle's dashboard and electrically connected in series for starting the vehicle, thereby reducing the possibility of a thief "hot-wiring" the vehicle, thus, combating its theft.

It is still another object of the present invention to provide a vehicle security apparatus that is simple in construction and may be manufactured easily and inexpensively.

Certain of the foregoing and related objects are readily obtained in a vehicle security apparatus for use in a motor vehicle, comprising: an optical key having a transmitter having at least one first preprogrammed coded signal stored in a first electric circuit; a receptacle for receiving the optical key and at least one transmittable coded optical signal from the transmitter corresponding to the at least one preprogrammed coded signal stored in the first electric circuit; a receiver for comparing the at least one transmittable coded optical signal to at least one second preprogrammed coded signal stored in a second electric circuit and the receiver being adapted to trigger switching effects for at least one of enabling starting the motor vehicle and starting the motor vehicle upon determination that the at least one transmittable coded optical signal corresponds to the at least one second preprogrammed signal in the second electric circuit; and at least one optical fiber having ends operatively connected between the receptacle and the receiver for carrying the optical signal from the receptacle to the receiver.

Certain of the foregoing and related objects are also readily obtained in a method for permitting only authorized use of a motor vehicle, comprising the steps of: generating at least one coded optical signal from an optical key having a transmitter having at least one first preprogrammed coded signal stored in a first electric circuit, said at least one optical signal corresponding to said at least one first preprogrammed coded signal; transmitting said at least one transmittable coded signal through at least one optical fiber; receiving in a receiver said at least one optical signal and detecting from said at least one fiber optic fiber said optical signal; comparing said detected at least one optical signal to at least one second preprogrammed coded signal stored in a second electric circuit; and triggering switching effects for at least one of enabling starting the motor vehicle and starting the motor vehicle upon determination that said at least one optical signal corresponds to said at least one second preprogrammed signal in said second electric circuit.

BRIEF DESCRIPTION OF THE DRAWINGS

Other objects and features of the present invention will become apparent from the following detailed description considered in connection with the accompanying drawings, which disclose several embodiments of the invention. It is to be understood that the drawings are to be used for the purpose of illustration only and not as a definition of the limits of the invention.

In the drawings, wherein similar reference characters denote similar elements throughout the several views.

DETAILED DESCRIPTION OF THE PREFERRED EMBODIMENTS

Figure 1:
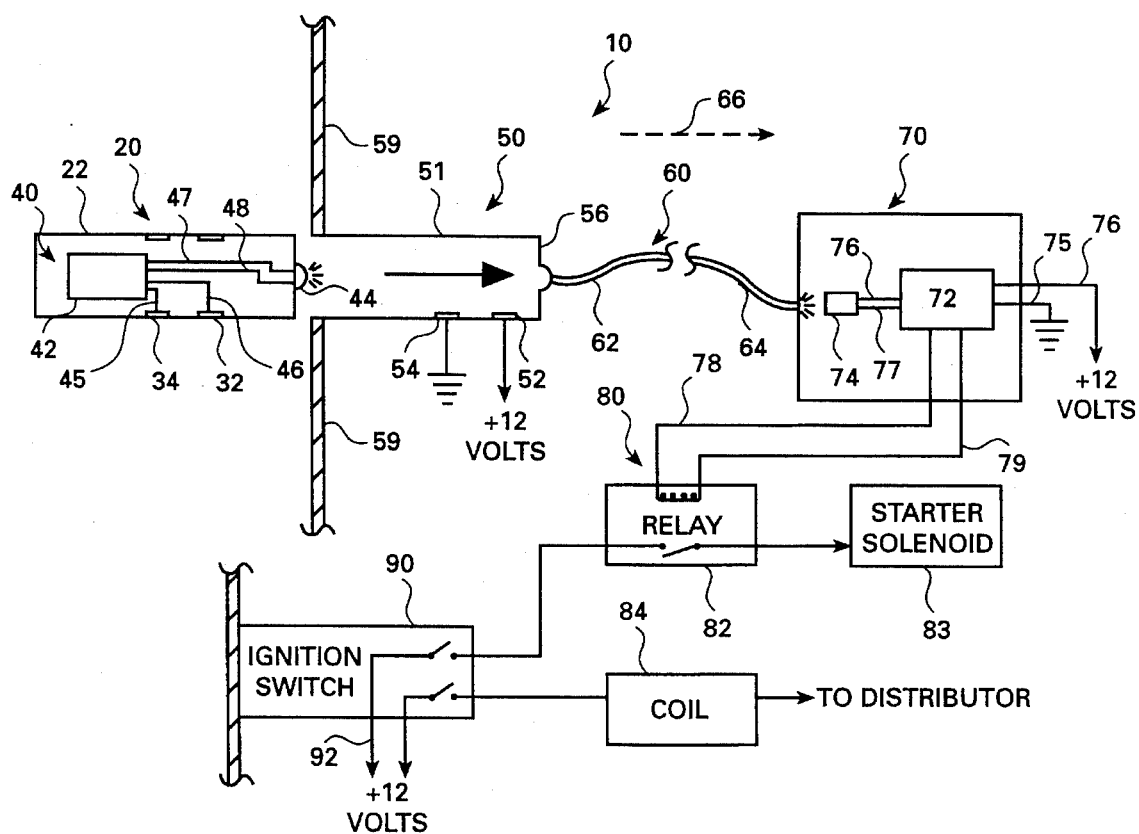
FIG. 1 is a schematic view of a vehicle security apparatus constructed according to the present invention for use in combination with a conventional ignition switch to start a motor vehicle.

Turning now to the drawings and in particular to FIG. 1, which illustrates a vehicle security apparatus 10 embodying the present invention for use in a motor vehicle for enabling the motor vehicle to be started.

Generally, vehicle security apparatus 10 includes an optical key 20, a key receptacle 50 for receiving optical key 20, a receiver 70, and at least one optical fiber 60 operatively connected to receptacle 50 and receiver 70. Optical key 20 contains an electronically stored first preprogrammed coded signal from which a reliable and accurate transmittable coded optical signal 66 is generated and carried via optical fiber 60 to receiver 70 where optical signal 66 is compared to a corresponding second preprogrammed coded signal in receiver 70. If optical signal 66 matches the second preprogrammed signal in receiver 70, receiver 70 is adapted to trigger switching effects for enabling the motor vehicle to be started. The term "optical" as used herein is to include, not only electromagnetic radiation in the visible spectrum, but also electromagnetic radiation in the invisible spectrum such as infrared radiation.

Figure 2:
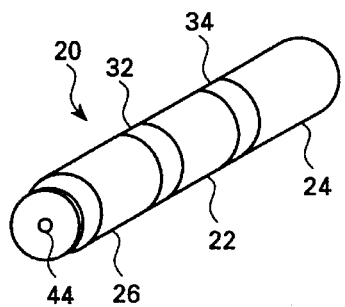
FIG. 2 is a perspective view of an optical key usable with the embodiment of the invention shown in FIG. 1.

As seen in FIGS. 1 and 2, optical key 20 generally includes a hollow cylindrically shaped housing 22 that houses a conventional transmitter 40. Electrical power for operating optical key 20 is supplied by connection to the vehicle's battery through electrical contacts, 32 and 34, each approximately ⅛ inch in width and located circumferentially around cylindrical body 22 in spaced relation. Alternatively, an internal rechargeable battery could be used. Preferably, housing 22 is made from an insulating material such as plastic.

Referring to FIG. 1, receptacle 50 is shown schematically as having an open hollow cylindrical housing 51 sized for receipt of optical key 20 and installed on a dashboard 59 of the vehicle. For supplying electrical power to optical key 20, receptacle 50 has an electrical contact 52 connected to the positive terminal of the vehicle's 12 volt battery and a spaced apart electrical contact 54 that is grounded. When optical key 20 is fully inserted in the direction of the arrow shown in housing 51 in FIG. I into receptacle 50, electrical contacts 32 and 34 of optical key 20 correspondingly engage electrical contacts 52 and 54 of receptacle 50, respectively, to power transmitter 40 in optical key 20 from the vehicle's 12 volt battery. Although, optical key 20 and receptacle 50 are shown as having cylindrical cross-sections, other cross-sectional configurations such as square or rectangular, as well as, alternate placement of electrical contacts 32 and 34, and 52 and 54, can be equally well employed.

Transmitter 40 is generally contained within cylindrical body 22 of optical key 20 and includes a first electric circuit 42 connected to a lamp 44 disposed on and extending from end 26 of cylindrical housing 22. Circuit 42 is connected to electrical contacts 32 and 34 by wires 45 and 46, and to lamp 44 by wires 47 and 48. Preferably, lamp 44 is a conventional Light Emitting Diode. Circuit 42 includes a suitable conventional Programmable Read Only Memory (PROM) for storing a first preprogrammed coded signal from which optical signal 66 is produced in conjunction with lamp 44 when lamp 44 is conventionally modulated by circuit 42 to vary the forward diode current to turn lamp 44 "on" and "off" producing a coded digital sequence of light pulses. Alternatively, optical signal 66 can be amplitude or frequency modulated. Thus, unlike other mechanical means for producing a coded signal that includes many inherent variabilities which often result in an inaccurate coded signal, use of an electronically generated optical signal traveling through an optical fiber invention produces reliable consistent optical signals, time after time. Further optical signals are beneficial because they are immune to electrical interference that generally affects electrical signals.

As is seen in FIG. 1, optical fiber 60 carries optical signal 66 from receptacle 50 to receiver 70. Specifically, end 62 of optical fiber 60 is attached to receptacle 50 at its end 56 in corresponding relation to lamp 44 when optical key 20 is fully inserted in receptacle 50. Preferably, receiver 70 is remotely located from receptacle 50 such as being positioned behind dashboard 59, under the vehicle's hood (not shown), within the vehicle's computer, or in some other location that is difficult for a thief to access from either inside or outside the vehicle.

Receiver 70, generally includes a second electric circuit 72 connected to a conventional photo diode 74. Electrical power for receiver 70 is supplied by the vehicle's battery. Specifically, circuit 72 is connected to the positive terminal of the vehicle's 12 volt battery by wire 76 and circuit 72 is grounded by wire 75. End 64 of optical fiber 60 is attached to receiver 70 in corresponding relation to photo diode 74 to receive optical signal 66. Photo diode 74 detects optical signal 66 and is connected to circuit 72 by wires 76 and 77. Circuit, 72 includes a suitable conventional PROM for storing a second preprogrammed coded signal which is programmed to correspond to the first preprogrammed coded signal stored in circuit 42 of transmitter 40 in optical key 20. Circuit 72 further includes suitable conventional able/disable logic circuitry for comparing detected optical signal 66 to the second preprogrammed coded signal stored in its PROM. Upon determination that detected optical signal 66 corresponds to the second preprogrammed signal in the PROM in circuit 72, receiver 70 is adapted to trigger switching effects for enabling starting the motor vehicle.

A means 80 for enabling starting the motor vehicle includes a "normally open" relay 82 connected to receiver 70 by wires 78 and 79. As shown in FIG. 1, relay 82 is electrically connected in series between the vehicle's battery (through wire 92 attached to a conventional ignition switch 90) and a starter solenoid 83. Alternatively, relay 82 can be electrically connected in series between the vehicle's battery and a coil 84 that leads to the vehicle's distributor. Still alternatively, means 80 for enabling starting the vehicle motor can include two relays, one electrically connected in series between the vehicle's battery and the vehicle's starter solenoid, and the other electrically connected in series between the vehicle's battery and the vehicle's coil.

In operation, receiver 70, once connected to the vehicle's battery via wire 76, is in a low power consumption active mode and awaits receipt of an appropriate coded optical signal 66 from transmitter 40. Transmitter 40 transmits an optical signal 66 corresponding to a first preprogrammed coded signal in circuit 42 when optical key 20 is fully inserted in receptacle 50 and receives electrical power from the vehicle's battery. Upon detection of optical signal 66 by receiver 70, detected optical signal 66 is compared in circuit 72 to the stored second preprogrammed coded signal and, if it corresponds, receiver 70 triggers switching effects to activate (i.e., "close") "normally open" relay 82 permitting a vehicle operator to start the motor vehicle by operating ignition switch 90. Receiver 70 includes a conventional timekeeping circuit so that if ignition switch 90 is not operated to start the vehicle's engine within a predetermined time such as thirty (30) seconds to three (3) minutes after first inserting optical key 20, relay 82 is opened requiring optical key 20 to be removed and reinserted to activate relay 82 again (i.e., "close" it) and enable starting the motor vehicle as described above.

Figure 4:
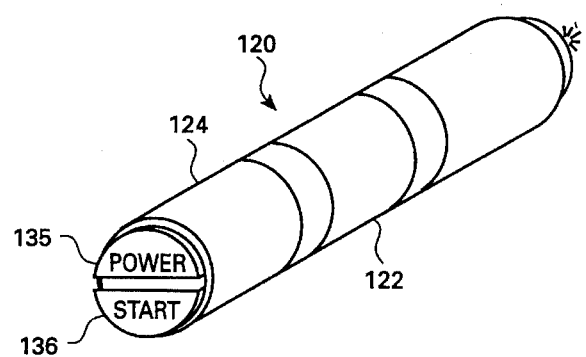
FIG. 4 is a perspective view of an optical key usable with the embodiment of the invention shown in FIG. 3.
Figure 3:
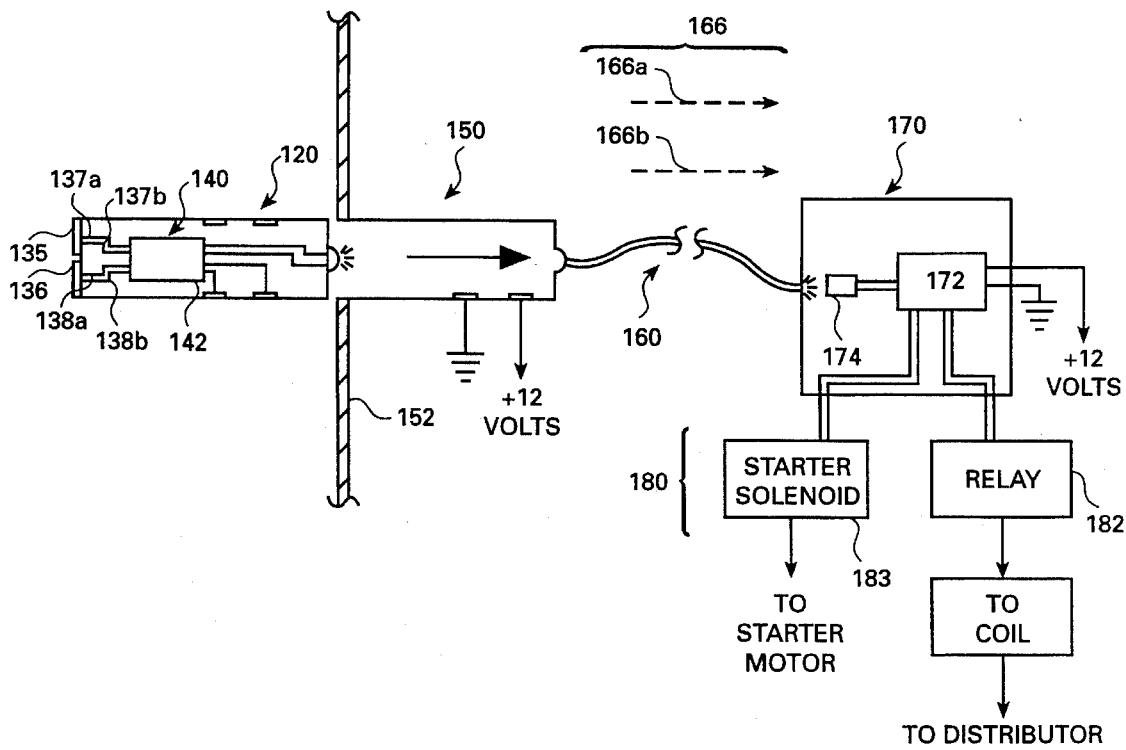
FIG. 3 is a schematic view of an preferred alternative embodiment of the present invention to start a motor vehicle and which eliminates the need for a conventional ignition switch.

FIGS. 3 and 4 show a preferred alternative embodiment of the invention for starting a motor vehicle. This embodiment eliminates the need for a conventional ignition switch and permits remotely locating the electrical circuits required to start the motor vehicle away from the vehicle's dashboard 152; thus reduce the possibility of a thief "hot-wiring" the vehicle. In order for a thief to operate the vehicle from within the interior of the vehicle, a thief is required to correctly transmit the required authorized transmittable coded optical signals 166 through optical fiber 160 to receiver 170.

Generally, vehicle security apparatus 100 includes an optical key 120, a receptacle 150 for receiving optical key 120, receiver 170, and at least one optical fiber 160 operatively connected to key receptacle 150 and receiver 170. Optical key 120 contains at least one electronically stored first preprogrammed coded signal from which reliable and accurate optical signals 166 are generated and carried via optical fiber 160 to receiver 170 where optical signals 166 are compared to at least one corresponding second preprogrammed coded signal stored in receiver 170. If optical signals 166 match at least one corresponding preprogrammed signal in receiver 170, receiver 170 is adapted to trigger switching effects for starting the motor vehicle.

As shown in FIG. 4, attached to end 124 of cylindrical body 122 of optical key 120 is a "POWER" push button 135 and a "START" push button 136 operatively connected (as in FIG. 3) by wires 137a and 137b, and 138a and 138b, respectively, for initiating generation of coded optical signals 166 to energize the vehicle's motor and subsequently start the motor vehicle.

A means 180 for enabling starting the motor vehicle include a "normally open" relay 182 and a "normally open" starter solenoid 183. Relay 182 is electrically connected in series between the vehicle's battery (not shown) and the vehicle's coil and a starter solenoid 183 is electrically connected in series between the vehicle's battery (not shown) and a starter motor.

In operation, of the embodiment shown in FIGS. 3 and 4, pressing "POWER" push button 135 of optical key 120 initiates generation of a first coded optical signal 166a by transmitter 140 corresponding to a first preprogrammed coded signal in circuit 142. Optical signal 166a is carried via optical fiber 160 to receiver 170 for detection in receiver 170 by photo diode 174 which is connected to circuit 172 for comparison of optical signal 66 to at least one second preprogrammed coded signal stored in circuit 172. If the compared signal correspond, receiver 170 triggers switching effects to activate (i.e., close) "normally open" relay 180 connected in series between the vehicle's 12 volt battery and the vehicle's coil to energize the vehicle's distributor and permit starting the motor vehicle upon receipt of subsequent "start" optical signal 166b. By momentarily pressing and holding "START" push button 136 in, optical key 120 is caused to transmit a repetitious and intermittent optical signal 166b. Preferably, optical signal 166b has a different form from optical signal 166a. If detected optical signal 166b corresponds to at least one preprogrammed coded signal in circuit 172, receiver 170 activates starter solenoid 183 to start the motor vehicle. Receiver 170 includes a conventional timekeeping circuit so that if optical signal 166b is not received by receiver 170 within a predetermined time such as thirty (30) seconds to three (3) minutes after "POWER" push button 135 has been pressed, relay 182 is "opened" requiring "POWER" push button 135 to be pushed again to energize the vehicle's motor.

It is to be understood that optical key 120 can include a single preprogrammed coded signal and a single push button from which optical signals are generated sequentially upon pressing the single push button to start the vehicle. It is also be understood that both energizing the motor vehicle and starting the vehicle's motor can simultaneously occur.

Figure 5:
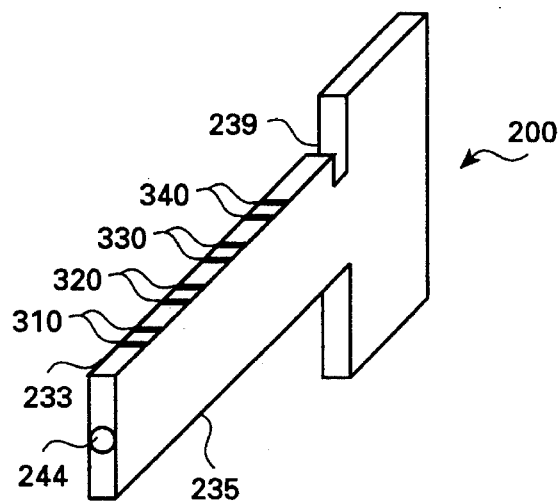
FIG. 5 is a preferred embodiment of an optical key for use with another embodiment of the present invention.
Figure 6:
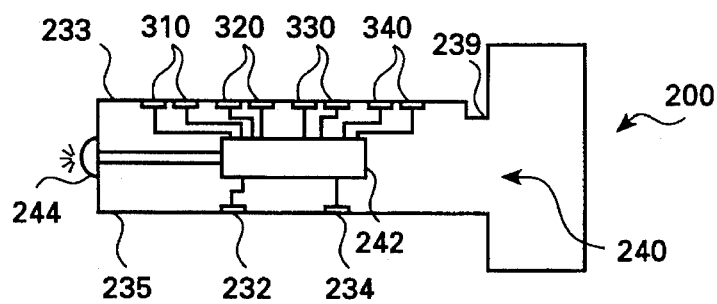
FIG. 6 is a side profile of the optical key shown in FIG. 5 illustrating an embedded electric circuit.

FIGS. 5 and 6, show a preferred embodiment of an optical key for use with the preferred alternative embodiment of the invention shown in FIG. 3 for starting a motor vehicle. Optical key 200 is generally similar in appearance, as well as similar in use, to conventional keys. Specifically, optical key 200 is generally rectangular in cross-section and includes a means for rotatably initiating a sequence of transmittable signals in a slotted receptacle 400 (see FIG. 7) for starting the motor vehicle.

Optical key 200 contains a transmitter 240 (see FIG. 6) having an electric circuit 242 and lamp 244. Attached to upper elongate side 233 are various pairs of electrical contacts 310, 320, 330, and 340. Specifically, the various contacts correspond respectively, to the functions, "OFF", "AUX," "ON", and "START". Attached to lower elongate side 235 of optical key 200 are electrical contacts 232 and 234 for receiving electrical power from receptacle 400. By rotating optical key 200 in receptacle 400, electrical conductive contacts (not shown) in receptacle 400 sequentially span the paired electrical contacts of the respective pairs of 310, 320, 330, and 340 and thereby initiate generation of coded optical signals in sequence to properly start the motor vehicle. A notch 239 near the base of optical key 200 interacts with a receptacle detent 410 (see FIG. 7) to require counter-rotating optical key 200 back to the "OFF" position to permit optical key 200 to be removed from receptacle 400.

Figure 7:
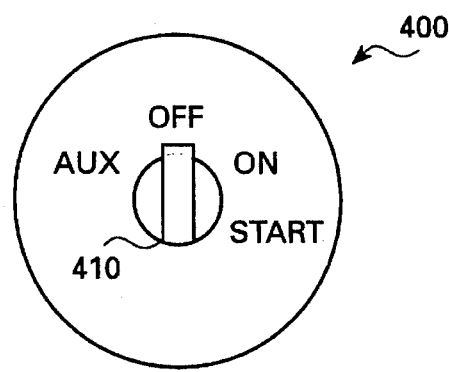
FIG. 7 is a front view of a receptacle for receiving the optical key shown in FIG. 6.

In operation of optical key 200 and receptacle 400, shown in FIGS. 5–7, optical key 200 is inserted in receptacle 400. Rotation of optical key 200 to an "ON" position initiates generation of an optical signal to a receiver (not shown) to trigger switching effects to activate (i.e., "close") a "normally open" relay connected in series between the battery and the coil of the motor vehicle. Rotating and holding optical key 200 in a "START" position generates an intermittent optical signal to a receiver to trigger switching effects to activate (i.e., "close") a "normally open" starter solenoid connected in series between the battery and the starter motor of the motor vehicle. Rotation of optical key 200 to its "OFF" position generates an optical signal to a receiver to trigger switching effects to activate (i.e., reopen) relay 180 connected in series between the battery and the coil of the motor vehicle to stop the vehicle's motor. Also shown in FIG. 7, rotation of optical key 200 to an "AUX" position generates an optical signal to a receiver to trigger switching effects to activate other electrical systems in the vehicle such electrical systems for powering the radio, lights and windows.

Referring again the FIGS. 1 and 3, it should be recognized that receivers 70 and 170 can be made to further include disabling circuitry for disabling receiver 70 and 170 for a period of time upon detection of a noncorresponding optical coded signal to at least one second preprogrammed signal in receiver 70 and 171.

Thus, while only several embodiments of the present invention have been shown and described, it is obvious that many changes and modifications may be made in such disclosed embodiments without departing from the spirit and scope of the invention.

I claim:

1. A vehicle security apparatus for use in a motor vehicle, comprising:

an optical key having a transmitter having at least one first preprogrammed coded signal stored in a first electric circuit;

a receptacle for receiving said optical key and at least one transmittable coded optical signal from said transmitter corresponding to said at least one first preprogrammed coded signal stored in said first electric circuit;

a receiver for comparing said at least one transmittable coded optical signal to at least one second preprogrammed coded signal stored in a second electric circuit and said receiver being adapted to trigger switching effects for at least one of enabling starting the motor vehicle and starting the motor vehicle upon determination that said at least one transmittable coded optical signal corresponds to said at least one second preprogrammed signal in said second electric circuit;

at least one optical fiber operatively connected between said receptacle and said receiver for carrying said optical signal from said receptacle to said receiver;

operatively connected means for starting the motor;

said transmitter having a light emitting diode for producing said optical signal, said receiver having a photo diode for detecting said optical signal, and said optical key having a means for rotatably initiating a sequential generation of said transmittable coded optical signals in said receptacle for starting the motor vehicle.

2. The vehicle security apparatus according to claim 1, wherein said means for rotatably initiating a sequential generation of said transmittable coded optical signals in said receptacle for starting the motor vehicle includes said optical key having a plurality of electrical contact pairs for engaging said receptacle.

* * * * *